(12) United States Patent
Choi

(10) Patent No.: US 6,849,382 B2
(45) Date of Patent: Feb. 1, 2005

(54) PHOTOSENSITIVE POLYMER CONTAINING SILICON AND A RESIST COMPOSITION USING THE SAME

(75) Inventor: Sang-Jun Choi, Seoul (KR)

(73) Assignee: Samsung Electronics Co., LTD, Kyungki-Do (KR)

( * ) Notice: Subject to any disclaimer, the term of this patent is extended or adjusted under 35 U.S.C. 154(b) by 0 days.

(21) Appl. No.: 10/721,400

(22) Filed: Nov. 25, 2003

(65) Prior Publication Data

US 2004/0126699 A1 Jul. 1, 2004

(30) Foreign Application Priority Data

Dec. 30, 2002 (KR) ................................. 10-2002-0086875

(51) Int. Cl.[7] .......................... G03C 1/73; G03F 7/039; C08F 34/02; C08F 222/06; C08F 230/08
(52) U.S. Cl. ..................... 430/270.1; 430/905; 430/910; 430/914; 430/921; 430/925; 430/326; 526/266; 526/270; 526/271; 526/279
(58) Field of Search ................................. 526/266, 270, 526/271, 279; 430/270.1, 905, 910, 914, 921, 925, 326

(56) References Cited

U.S. PATENT DOCUMENTS 6,051,362 A * 4/2000 Choi et al. ............... 430/270.1

2004/0137363 A1 * 7/2004 Choi et al. ............... 430/270.1

* cited by examiner

Primary Examiner—Cynthia H. Kelly
Assistant Examiner—Sin J. Lee
(74) Attorney, Agent, or Firm—F. Chau & Associates, LLC

(57) ABSTRACT

A photosensitive polymer including silicon and a resist composition using the same are disclosed. The photosensitive polymer has the following formula 1.

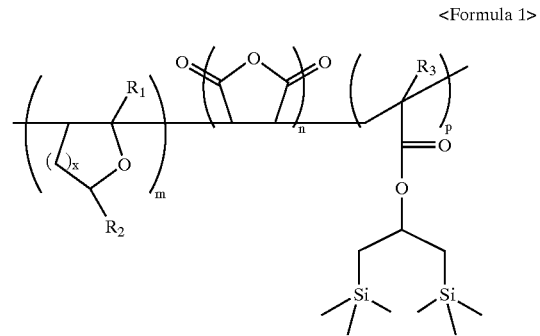

<Formula 1>

In formula 1, $R_1$ of the first monomer and $R_3$ of the third monomer are an alkyl group. $R_2$ of the first monomer is hydrogen, alkyl, alkoxy, or carbonyl. The X of the first monomer is an integer selected from 1 to 4. Further, $m/(m+n+p)$ is about 0.1 to about 0.4, $n/(m+n+p)$ is about 0.1 to about 0.5, and $p/(m+n+p)$ is about 0.1 to about 0.4.

18 Claims, No Drawings

PHOTOSENSITIVE POLYMER CONTAINING SILICON AND A RESIST COMPOSITION USING THE SAME

BACKGROUND OF THE INVENTION

1. Technical Field of the Invention

The present invention relates generally to a photosensitive polymer and a resist composition using the same. More particularly, the present invention relates to a photosensitive polymer including silicon and a resist composition including the same.

2. Discussion of Related Art

As semiconductor devices become more highly integrated, a photolithography process requires patterns with finer detail. In addition, the fabrication of semiconductor devices on a scale of one gigabit requires a new light source having a shorter wavelength, such as an ArF excimer laser ($\lambda$=193 nm) or a F2 ($\lambda$=157 nm) laser, than the conventional light source, such as a KrF excimer laser ($\lambda$=248 nm). Further, a new resist composition is required for the new light source.

However, the new resist composition created for use with the ArF or F2 has some problems, e.g., dry etch resistance or pattern collapse, as compared with a conventional resist composition used in conjunction with a KrF or i-line ($\lambda$=365 nm) in a conventional photolithography process. Thus, a new process and a new material for the resist composition are required to prevent the above identified problems.

Generally, there are two types of photolithography processes. One is a single-layer resist (SLR) process and another is a bi-layer resist (BLR) process. In the SLR process, a photoresist is patterned by using a photolithography process. Next, a desired layer is patterned by using the patterned photoresist. In the BLR process, a bottom layer and a top photoresist (TPR) are sequentially stacked. The TPR is patterned by a photolithography process. The bottom layer is then patterned by using the TPR pattern as a dry etch mask, thereby forming a bottom layer mask. Next, a desired layer is patterned by using the bottom layer mask. The BLR process provides no pattern collapse and greater dry etch resistance as compared to the SLR process. Thus, the BLR process is preferred for forming a very fine pattern. The BLR process usually employs TPR compositions containing a polymer in which a monomer containing a group with silicon is polymerized.

Foster discloses a photosensitive polymer for a TPR having the following formula in "Second Generation 193 nm Bilayer Resist", Proc. SPIE. Vol. 3678, pp. 1034–1039.

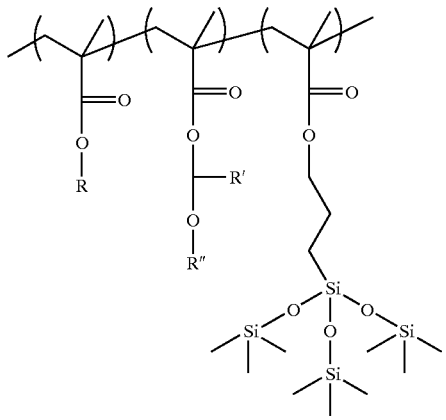

In the above formula, a third monomer contains a bulky group of Si—O—Si. Since Silicon (Si) has a high resistance with respect to a dry etch process, it is preferable to have a high concentration of Si. However, silicon is hydrophobic. Due to the bulky Si—O—Si group contained in the above formula, the hydrophobicity of the photosensitive polymer increases causing a decrease in adhesive strength or a decrease in wet-ability to a hydrophilic bottom layer. Thus, the photoresist polymer having a high concentration of Si has a low resolution and a decrease in performance.

Therefore, a need exists to provide a photosensitive polymer to be used as a top photoresist in a BLR process that has a greater dry etch resistance and adhesive strength than a conventional photosensitive polymer. In addition, there is also a need to provide a resist composition using the same.

SUMMARY OF THE INVENTION

An aspect of the present invention is to provide a photosensitive polymer for a top photoresist in a BLR process that has an increase in dry etch resistance and adhesive strength as compared to a conventional photoresist, and to provide a resist composition using the same.

Embodiments of the invention are directed to a photosensitive polymer having the following formula 1 composed of a first, a second and a third monomers.

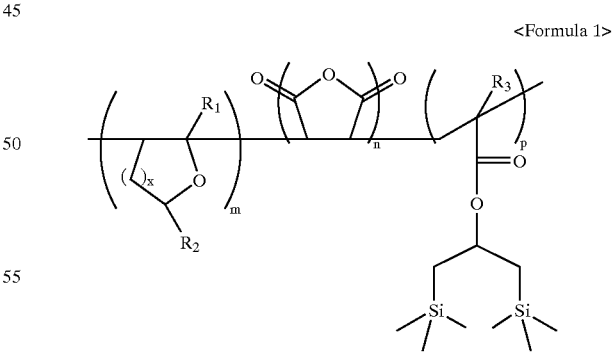

<Formula 1>

In the formula 1, $R_1$ of the first monomer and $R_3$ of the third monomer are an alkyl group, and $R_2$ of the first monomer is hydrogen, an alkyl group, an alkoxy group, or a carbonyl group. X of the first monomer is an integer from 1 to 4. And, $m/(m+n+p)$ is about 0.1 to about 0.4, $n/(m+n+p)$ is about 0.1 to about 0.5, and $p/(m+n+p)$ is about 0.1 to about 0.4. A weight-average molecular weight of the photosensitive polymer is preferably about 3,000 to about 100,000.

Preferably, $R_1$ of the first monomer and $R_3$ of the third monomer are either hydrogen or a methyl group. Preferably, $R_2$ is hydrogen, a methoxy group, or an ethoxy group.

In the first and second monomers contained in the photosensitive polymer of the formula 1, an ether group is hydrophilic and provides an increase in adhesive strength, and a cyclic structure provides an increase in resistance with respect to a dry etch as compared to a conventional photosensitive polymer. The third monomer of the photosensitive polymer, as shown above, has a silicon-containing group that is, preferably, a bis(trimethylsilyl)propyl group. Since the silicon-containing group of the photosensitive polymer has a smaller volume than a silicon-containing group of a conventional photoresist polymer, there is a decrease in the hydrophobicity of the photosensitive polymer represented by formula 1. Further, the concentration of Si may be increased to improve the resistance with respect to a dry etch of the photosensitive polymer.

When the photosensitive polymer is exposed to light, a portion of the third monomer comprising silicon is decomposed under a catalyst of acid, thereby substituting the silicon group with hydrogen. Thus, the third monomer then comprises a carboxyl group which causes the structure to become hydrophilic. In addition, after being exposed to light, the photosensitive polymer will readily dissolve in a developing solution.

According to another aspect of the present invention, the photosensitive polymer illustrated by formula 1 above may further include a fourth monomer. The fourth monomer may be acrylate, methacrylate, acrylonitrile, methacrylonitrile, norbornene, styrene, or any derivative thereof. At this time, the third monomer is about 5 to about 30 wt. % of the photosensitive polymer. The fourth monomer may alleviate a repulsive force between the first and second monomers of hydrophilicity and the third monomer of with respect to hydrophobicity.

Embodiments of the present invention directed to a resist composition include a photo acid generator (PAG) and a photosensitive polymer comprising three or four monomers. The PAG is about 1.0 to about 15.0 wt. % of the photosensitive polymer. The PAG may be triarylsulfonium salts or diaryliodonium salts. Preferably, the PAG is selected from a group consisting of triphenylsulfonium triflate, diphenyliodonium triflate and di-t-butylphenyliodonium triflate.

The resist composition may further include a base additive. The base additive may be about 0.01 to about 2.0 wt. % of the photosensitive polymer. The base additive is preferably an organic tertiary amine.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

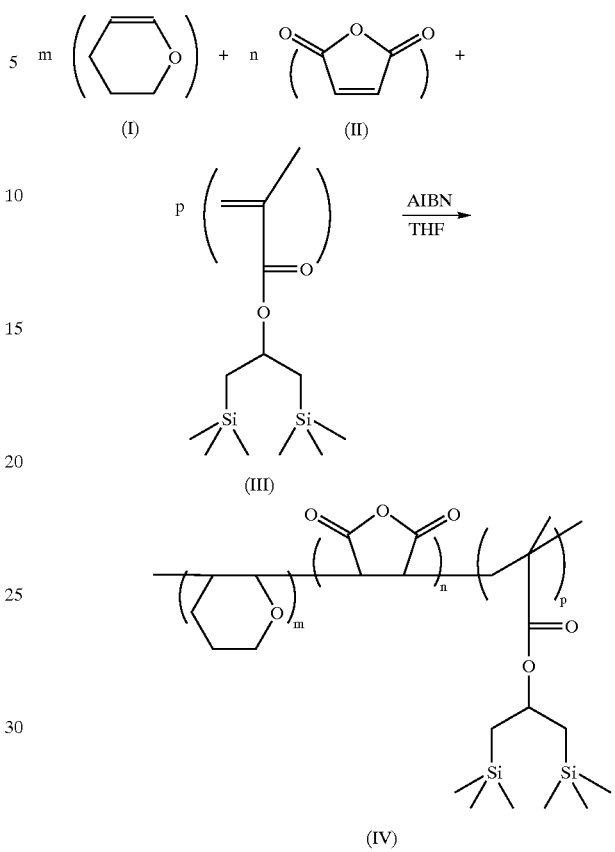

In a flask, about 0.85 g (10 mmol) of 3,4-dihydro-2H-pyran (I), about 1.0 g (10 mmol) of maleic anhydride (II), and about 5.5 g (20 mmol) of bis(trimethylsilyl)propyl methacrylate (III) were dissolved in a combination of about 8 g of anhydrous tetrahydrofuran (THF) and about 0.13 g of azobisisobutyronitrile, AIBN, (2 mol %). After degassing by using $N_2$ gas, reactants I, II and III were polymerized at a temperature of about 65° C. for about 20 hours. After finishing the polymerization, preliminary products were slowly precipitated in excessive quantity of isopropyl alcohol. A sediment was collected by filtration and dissolved in a predetermined quantity of THF. The dissolved sediment was then re-precipitated in n-hexane. Next, the re-precipitated sediment was dried for about 24 hours in a vacuum oven at a temperature of about 50° C. A photosensitive polymer IV having a yield of about 60% was collected. In addition, the photosensitive polymer IV had a weight-average molecular weight of about 8,700 and dispersion (weight-average molecular weight/number-average molecular weight) of about 1.9.

A photosensitive polymer IV, formed by synthesis 1 discussed above, comprises a group containing Si represented by a bis(trimethylsilyl)propyl methacrylate (III) as shown above in the third monomer. Since the group including Si has a smaller volume than a group containing Si in a conventional photosensitive polymer, there is a decrease in the hydrophobicity of the photosensitive polymer IV as compared to the conventional photosensitive polymer. Further, the concentration of Si may be increased to improve the resistance with respect to a dry etch of the photosensitive polymer. Additionally, the 3-4-dihydro-2H-pyran (I) and the maleic anhydride (II) have ether group (—O—), which is hydrophilic and improves the adhesive force and resolution of the photosensitive polymer. Also, monomers I and II have an aliphatic structure that improves the high resistance with respect to a dry etching of the photosensitive polymer.

Synthesis 2.

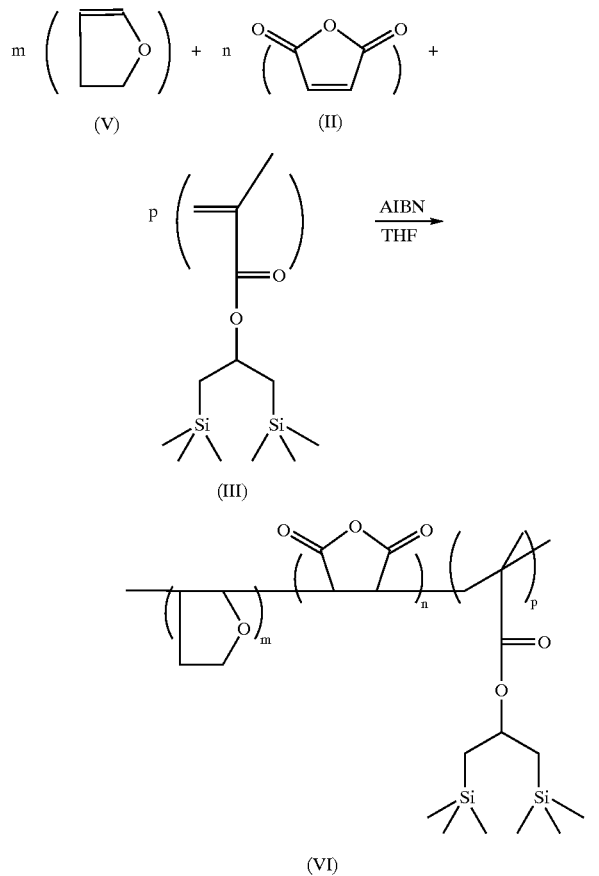

In a flask, about 0.70 g (10 mmol) of 2,3-dihydro-2H-furan (V), about 1.0 g (10 mmol) of maleic anhydride (II), and about 5.5 g (20 mmol) of bis(trimethylsilyl)propyl methacrylate (III) were dissolved in a combination of 8 g of anhydrous THF and about 0.13 g of AIBN (2 mol %). About a 60% yield of photosensitive polymer VI was obtained, using the same steps as discussed above with respect to synthesis 1, having a weight-average molecular weight of about 7,600 and a dispersion of about 1.9.

Synthesis 3.

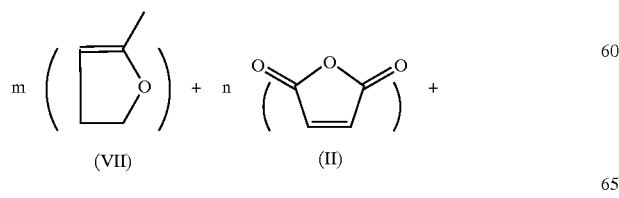

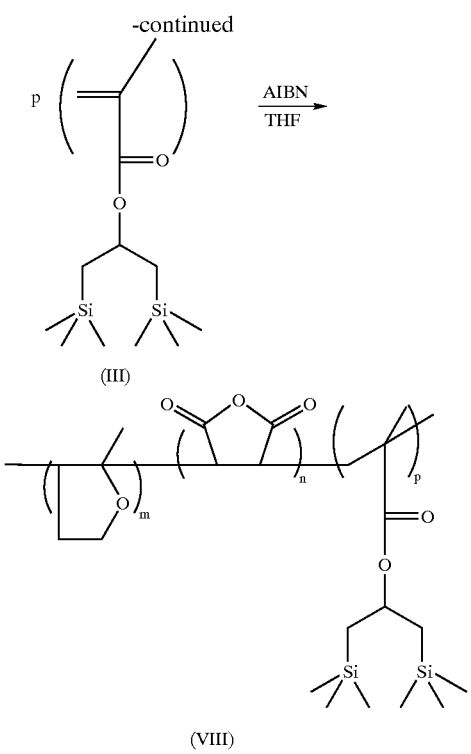

In a flask, about 0.84 g (10 mmol) of 4,5-dihydro-2-methylfuran (VII), about 1.0 g (10 mmol) of maleic anhydride (II), and about 5.5 g (20 mmol) of bis(trimethylsilyl) propyl methacrylate (III) were dissolved in a combination of about 0.8 g of anhydrous THF and about 0.13 g of AIBN (2 mol %). About a 55% yield of photosensitive polymer VIII was obtained, using the same steps as discussed above with respect to synthesis 1, having a weight-average molecular weight of about 7,100 and a dispersion of about 2.0.

Synthesis 4.

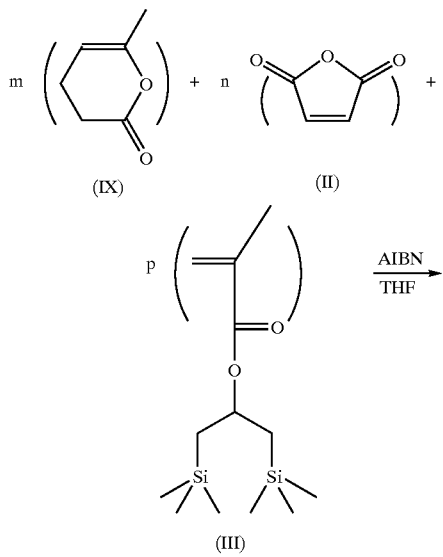

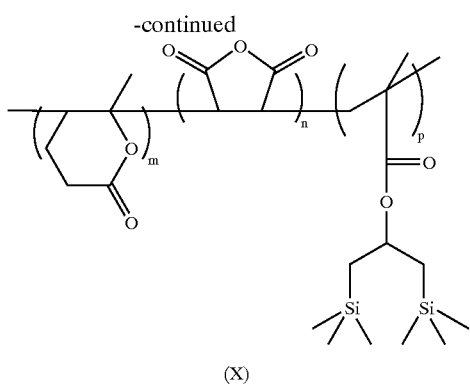

(X)

In a flask, about 1.1 g (10 mmol) of 3,4-dihydro-6-methyl-2H-pyran-2-one (IX), about 1.0 g (10 mmol) of maleic anhydride (II), and about 5.5 g (20 mmol) of bis(trimethylsilyl)propyl methacrylate (III) were dissolved in combination of about 8 g of anhydrous THF and about 0.13 g of AIBN (2 mol %). About a 50% yield of photosensitive polymer X was obtained, using the same steps as discussed above with respect to synthesis 1, having a weight-average molecular weight of about 7,000 and a dispersion of about 2.0.

Synthesis 5.

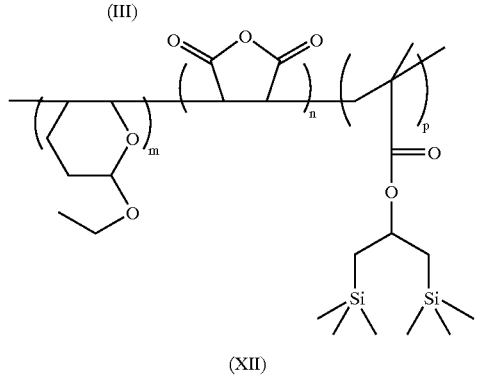

(XII)

In a flask, about 1.3 g (10 mmol) of 3,4-dihydro-2-ethoxy-2H-pyran (XI), about 1.0 g (10 mmol) of maleic anhydride (II), and about 5.5 g (20 mmol) of bis(trimethylsilyl)propyl methacrylate (III) were dissolved in a combination of about 8 g of anhydrous THF and about 0.13 g of AIBN (2 mol %). About a 60% yield of photosensitive polymer XII was obtained, using the same steps as discussed above with respect to synthesis 1, having a weight-average molecular weight of about 8,300 and a dispersion of about 2.0.

Synthesis 6.

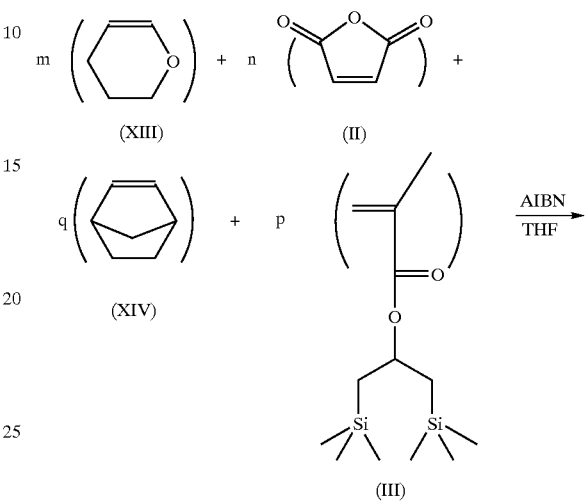

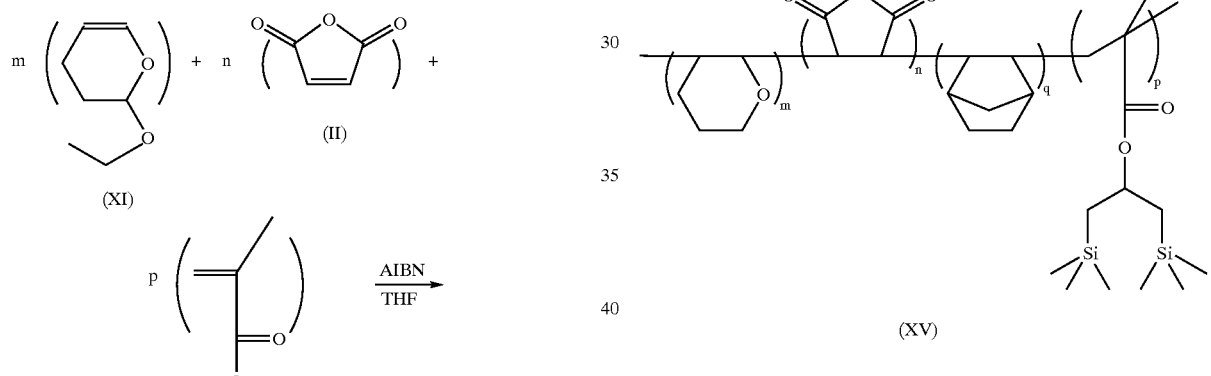

(XV)

In a flask, about 0.85 g (10 mmol) of 3,4-dihydro-2H-pyran (XIII), about 1.0 g (10 mmol) of maleic anhydride (II), about 0.5 g (5 mmol) of norbornene (XIV), and about 5.5 g (20 mmol) bis(trimethylsilyl)propyl methacrylate (III) were dissolved in a combination of about 8 g of anhydrous THF and about 0.15 g of AIBN (2 mol %). After degassing by using $N_2$ gas, reactants XIII, II, XIV and III were polymerized at a temperature of about 65° C. for about 20 hours. After finishing the polymerization, preliminary products were slowly precipitated in an excessive quantity of isopropyl alcohol. A sediment was filtered, collected, and dissolved in a predetermined quantity of THF. The dissolved sediment was then re-precipitated in n-hexane. Next, the re-precipitated sediment was dried for about 24 hours in a vacuum oven at a temperature of about 50° C. Thus, a photosensitive polymer XV was obtained, at a yield of about 60%, having a weight-average molecular weight of about 8,100 and a dispersion of about 1.9.

Embodiment 1

The present embodiment illustrates a method for forming a top photoresist pattern by using the photosensitive polymer IV obtained in synthesis 1.

About 1 g of photosensitive polymer IV was dissolved in about 10 g of propylene glycol methyl ether acetate (PGMEA) with about 0.02 g of triphenylsulfonium triflate (TPSOTf). Then, about 1 mg of triisobutylamine was dissolved in the solution above, thereby making a resist solution. Next, the resist solution was filtered using a 0.2 μm membrane filter. A bare Si wafer treated with hexamethyldisilazane (HMDS) was then coated with the filtered resist solution. Preferably, the resist solution coated on the wafer has a thickness of about 0.25 μm. Next, the wafer coated with the resist solution was pre-baked at a temperature of about 120° C. for about 60 seconds. And then, the pre-baked wafer was exposed to light by using an ArF stepper (0.6NA, σ 0.75). Next, a post-exposure bake (PEB) process was performed with respect to the exposed wafer at a temperature of about 120° C. for about 60 seconds. After the PEB process, the wafer was developed by using a 2.38 wt % of tetramethylammonium hydroxide (TMAH) solution for about 60 seconds. Further, a top photoresist pattern of 160 nm line/space could be obtained with about a 15 mJ/cm² dose.

A mechanism illustrating how the photosensitive polymer IV is changed when exposed to light is shown by the following reaction equation.

<Reaction equation>

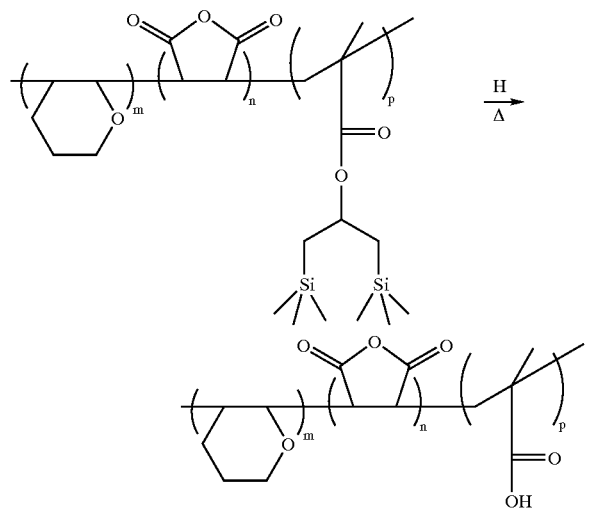

Before the photosensitive polymer, shown above, is exposed to light, the photosensitive polymer is shown comprising a third monomer (p) having a Si group. After the photosensitive polymer is exposed to light, the Si group of the third monomer is substituted with hydrogen thereby forming a carboxyl group, which is hydrophilic. Thus, the photosensitive polymer with the carboxyl group can be readily dissolved in a developing solution.

The photosensitive polymer formed above represents an improved top photoresist over a conventional top photoresist in a BLR photolithography process whose light sources are KrF (λ=248 nm), ArF(λ=193 nm) and F2(λ=157 nm) excimer lasers.

Embodiment 2

The present embodiment illustrates a method for forming a silicon nitride pattern by using a top photoresist pattern.

A silicon nitride layer of about 3000 Å is formed on a silicon wafer. The silicon wafer with the silicon nitride is then coated by an i-line resist with a thickness of about 500 nm and thermally treated at a temperature of about 220° C., thereby forming a bottom layer on the silicon nitride layer. Next, a resist composition is made by using the same method as discussed above with respect to embodiment 1 by using the photosensitive polymer IV formed in synthesis 1. The silicon wafer with the bottom layer is then coated with the resist composition having a thickness of about 250 nm. Next, the silicon wafer with the resist composition is pre-baked at a temperature of about 120° C. for about 90 seconds, thereby forming a top photoresist. The wafer with the top photoresist is exposed to light by using an ArF stepper (0.6 NA, σ=0.75). A PEB process is performed on the exposed wafer at a temperature of about 110° C. for about 60 seconds. After the PEB process, the wafer is developed by using a 2.38 wt. % TMAH solution for about 60 seconds. And then, a post-development bake (PDB) is performed at a temperature of about 110° C. for about 60 seconds, thereby forming a top photoresist pattern. A dry etch process is then performed with respect to the bottom layer by using the top photoresist pattern as a etch mask and by supplying plasma of oxygen($O_2$) and sulfur dioxide ($SO_2$), thereby forming a bottom layer pattern. The top photoresist pattern is removed. A dry etch process is performed with respect to the silicon nitride layer by using the bottom layer pattern as a mask by supplying plasma of $CF_4$ and etc, thereby forming a silicon nitride pattern. The bottom layer pattern is removed.

Accordingly, the photosensitive polymer of the present invention includes first and second monomers having an ether group, thereby having a photosensitive polymer that is hydrophilic with an improved adhesive strength over a conventional photosensitive polymer. Also, the photosensitive polymer including a cyclic structure provides improved resistance with respect to a dry etch over a conventional photosensitive polymer. The third monomer included in a photosensitive polymer has a silicon-containing group that is preferably a bis(trimethylsilyl)propyl group. Since the silicon-containing group of the photosensitive polymer has a less bulkier structure than a conventional photoresist polymer, there is a decrease in the hydrophobicity of the photosensitive polymer. Further, the concentration of Si may be increased to improve resistance with respect to a dry etch of the photosensitive polymer. After the photosensitive polymer is exposed to light, the Si containing group is substituted with hydrogen, thereby forming a carboxyl group on the third monomer. Thus, the photosensitive polymer including the third monomer with a carboxyl group will readily dissolve in a developing solution.

What is claimed is:

1. A photosensitive polymer comprising a first monomer, a second monomer, and a third monomer of formula:

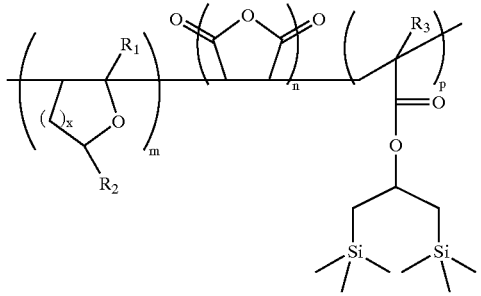

wherein $R_1$ of the first monomer and $R_3$ of the third monomer are either hydrogen or an alkyl group;

$R_2$ of the first monomer is selected from a group consisting of hydrogen, alkyl, alkoxy and carbonyl;

X of the first monomer is an integer selected from 1 to 4; and m/(m+n+p) is about 0.1 to about 0.4, n/(m+n+p) is about 0.1 to about 0.5, and p/(m+n+p) is about 0.1 to about 0.4.

2. The photosensitive polymer as claimed in claim 1, wherein a weight-average molecular weight of the photosensitive polymer is about 3,000 to about 100,000.

3. The photosensitive polymer as claimed in claim 1, wherein the $R_1$ of the first monomer and the $R_3$ of the third monomer are hydrogen or a methyl group.

4. The photosensitive polymer as claimed in claim 1, wherein the $R_2$ of the first monomer is a methoxy group or an ethoxy group.

5. The photosensitive polymer as claimed in claim 1, further comprising a fourth monomer, wherein the fourth monomer is selected from a group consisting of acrylate, methacrylate, acrylonitrile, methacrylonitrile, norbornene, styrene, and any derivative thereof.

6. The photosensitive polymer as claimed in claim 5, wherein the third monomer is about 5 wt. % to about 30 wt. % of the photosensitive polymer.

7. A resist composition comprising a photo acid generator (PAG) and a photosensitive polymer, wherein the photosensitive polymer comprises a first monomer, a second monomer, and a third monomer of formula:

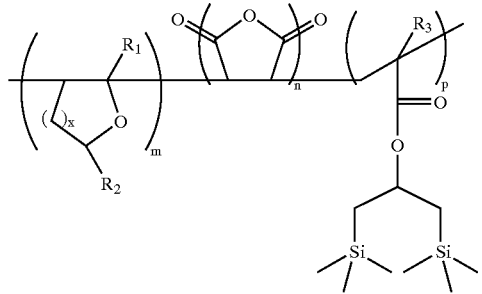

wherein $R_1$ of the first monomer and $R_3$ of the third monomer are either hydrogen or an alkyl group;
$R_2$ of the first monomer is selected from a group consisting of hydrogen, alkyl, alkoxy and carbonyl;
X of the first monomer is an integer selected from 1 to 4; and
m/(m+n+p) is about 0.1 to about 0.4, n/(m+n+p) is about 0.1 to about 0.5, and p/(m+n+p) is about 0.1 to about 0.4.

8. The resist composition as claimed in claim 7, wherein the PAG is about 1.0 wt. % to about 15.0 wt. % of the photosensitive polymer.

9. The resist composition as claimed in claim 7, wherein the PAG is triarylsulfonium salts or diaryliodonium salts.

10. The resist composition as claimed in claim 7, wherein the PAG is triphenylsulfonium triflate, diphenyliodonium triflate, or di-t-butylphenyliodonium triflate.

11. The resist composition as claimed in claim 7, further comprising a base additive.

12. The resist composition as claimed in claim 11, wherein the base additive is about 0.01 wt. % to about 2.0 wt. % of the photosensitive polymer.

13. The resist composition as claimed in claim 11, wherein the base additive is an organic tertiary amine.

14. The resist composition as claimed in claim 7, wherein the photosensitive polymer has a weight-average molecular weight of about 3,000 to about 100,000.

15. The resist composition as claimed in claim 7, wherein the $R_1$ of the first monomer and the $R_3$ of the third monomer of the photosensitive polymer are hydrogen or a methyl group.

16. The resist composition as claimed in claim 7, wherein the $R_2$ of the first monomer of the photosensitive polymer is a methoxy group or an ethoxy group.

17. The resist composition as claimed in claim 7, wherein the photosensitive polymer further comprises a fourth monomer, wherein the fourth monomer is acrylate, methacrylate, acrylonitrile, methacrylonitrile, norbornene, styrene, or any derivative thereof.

18. The photosensitive polymer as claimed in claim 17, wherein the third monomer is about 5 wt. % to about 30 wt. % of the photosensitive polymer.

* * * * *